US012700877B2

(12) United States Patent
Pinho et al.

(10) Patent No.: US 12,700,877 B2
(45) Date of Patent: Aug. 4, 2026

(54) OPTIMIZING LOSSY COMPRESSION FOR NONHOMOGENEOUS MULTIVARIATE BLACK-BOX CLASSIFICATION MODELS

(71) Applicant: Dell Products L.P., Round Rock, TX (US)

(72) Inventors: Rômulo Teixeira De Abreu Pinho, Niterói (BR); Vinicius Michel Gottin, Rio de Janeiro (BR); Paulo de Figueiredo Pires, Niterói (BR); Alex Laier Bordignon, Niterói (BR); João Victor Daher Daibes, Niterói (BR); Franklin Jordan Ventura Quico, Niterói (BR)

(73) Assignee: Dell Products L.P., Round Rock, TX (US)

( * ) Notice: Subject to any disclaimer, the term of this patent is extended or adjusted under 35 U.S.C. 154(b) by 138 days.

(21) Appl. No.: 18/897,124

(22) Filed: Sep. 26, 2024

(65) Prior Publication Data

US 2026/0088830 A1 Mar. 26, 2026

(51) Int. Cl.
H03M 7/00 (2006.01)
H03M 7/30 (2006.01)

(52) U.S. Cl.
CPC ....... H03M 7/6041 (2013.01); H03M 7/6005 (2013.01); H03M 7/6011 (2013.01)

(58) Field of Classification Search
CPC . H03M 7/6041; H03M 7/6094; H03M 7/6082
USPC .............................................. 341/50, 52, 51
See application file for complete search history.

(56) References Cited

U.S. PATENT DOCUMENTS

| | | | |
|---|---|---|---|
| 12,231,152 B2* | 2/2025 | Shin ..................... | G06N 3/0495 |
| 2021/0295210 A1* | 9/2021 | Wetherbee ............. | G06N 20/00 |
| 2024/0311621 A1* | 9/2024 | Kumaraswamy ...... | G06N 3/045 |
| 2026/0052402 A1* | 2/2026 | Isci ...................... | H04W 24/02 |

OTHER PUBLICATIONS http://www.timeseriesclassification.com/description.php?Dataset= BasicMotions; accessed Jun. 25, 2024.
https://en.wikipedia.org/wiki/MNIST_database; accessed Jun. 25, 2024.
http://timeseriesclassification.com/description.php?Dataset= ItalyPowerDemand; accessed Jun. 25, 2024.

(Continued)

*Primary Examiner* — Peguy Jean Pierre
(74) *Attorney, Agent, or Firm* — Workman Nydegger

(57) ABSTRACT

A service compresses a data set in accordance with a data compression rate, resulting in generation of compressed data having a first data quality. The service decompresses the compressed data, resulting in generation of decompressed data. The service filters, from the decompressed data, data that is identified as belonging to a selected class of data. The service causes an ML classifier to perform a classification operation on the data that is identified as belonging to the selected class of data. The service determines a classification accuracy of the classification operation performed by the ML classifier. The service determines whether the classification accuracy at least meets a threshold accuracy requirement. If the threshold is met, the data compression rate is increased; otherwise, it is decreased.

20 Claims, 9 Drawing Sheets

(56) References Cited

OTHER PUBLICATIONS https://www.kaggle.com/datasets/arbazkhan971/anomaly-detection; accessed Jun. 25, 2024.

https://scikit-learn.org/stable/supervised_learning.html; accessed Jun. 25, 2024.

https://arxiv.org/pdf/2101.08784.pdf; accessed Jun. 25, 2024.

https://ieeexplore.ieee.org/document/8767351; accessed Jun. 25, 2024.

* cited by examiner

Architecture
100

Cloud
115

ML Classifier
125

Service
105

ML Engine
110

Edge
Device
105A

Compression
Rate
120

Data Compressor
120A

Table
600

| | DCT | | JPEG | | RLTC | | T |
|---|---|---|---|---|---|---|---|
| | Train | Test | Train | Test | Train | Test | |
| Compression Rate | 0.97 | 0.97 | 0.62 | 0.65 | 0.30 | 0.32 | - |
| Class 0 Preserved Accuracy | 1.00 | 1.00 | 1.00 | 1.00 | 1.00 | 1.00 | 0.75 |
| Class 1 Preserved Accuracy | 1.00 | 1.00 | 1.00 | 1.00 | 1.00 | 1.00 | 0.95 |
| Class 2 Preserved Accuracy | 1.00 | 1.00 | 1.00 | 0.80 | 0.80 | 1.00 | 0.65 |
| Class 3 Preserved Accuracy | 1.00 | 0.80 | 0.93 | 0.80 | 0.80 | 0.80 | 0.75 |

Basic Motions – MLP

Figure 6

Table 700

| Rate | MNIST | | | | | | ITALY DEMAND | | | | | | BASIC MOTIONS | | | | | | |
|---|---|---|---|---|---|---|---|---|---|---|---|---|---|---|---|---|---|---|---|
| | DCT | | JPEG | | RLTC | | DCT | | JPEG | | RLTC | | DCT | | JPEG | | RLTC | | |
| | Train | Test | Train | Test | Train | Test | Train | Test | Train | Test | Train | Test | Train | Test | Train | Test | Train | Test | |
| Success | 1 | 0.98 | 1 | 0.98 | 1 | 0.95 | 1 | 0.88 | 1 | 0.96 | 1 | 0.87 | 1 | 0.96 | 1 | 0.87 | 1 | 0.94 | LOG. |
| Avg. Comp. | 0.63 | 0.63 | 0.22 | 0.23 | 0.63 | 0.62 | 0.18 | 0.18 | 0.11 | 0.15 | 0.18 | 0.18 | 0.82 | 0.82 | 0.33 | 0.43 | 0.39 | 0.4 | |
| Success | 1 | 0.96 | 1 | 0.91 | 1 | 0.96 | 1 | 0.94 | 1 | 0.92 | 1 | 0.83 | 1 | 0.97 | 1 | 0.87 | 1 | 0.96 | SVM |
| Avg. Comp. | 0.51 | 0.51 | 0.11 | 0.12 | 0.53 | 0.52 | 0.17 | 0.17 | 0.1 | 0.15 | 0.19 | 0.19 | 0.89 | 0.89 | 0.3 | 0.4 | 0.39 | 0.4 | |
| Success | 1 | 0.98 | 1 | 0.96 | 1 | 0.95 | 1 | 0.95 | 1 | 0.94 | 1 | 0.81 | 1 | 0.95 | 1 | 0.84 | 1 | 0.92 | MLP |
| Avg. Comp. | 0.61 | 0.61 | 0.19 | 0.19 | 0.59 | 0.59 | 0.2 | 0.2 | 0.1 | 0.15 | 0.19 | 0.19 | 0.85 | 0.85 | 0.51 | 0.54 | 0.3 | 0.32 | |

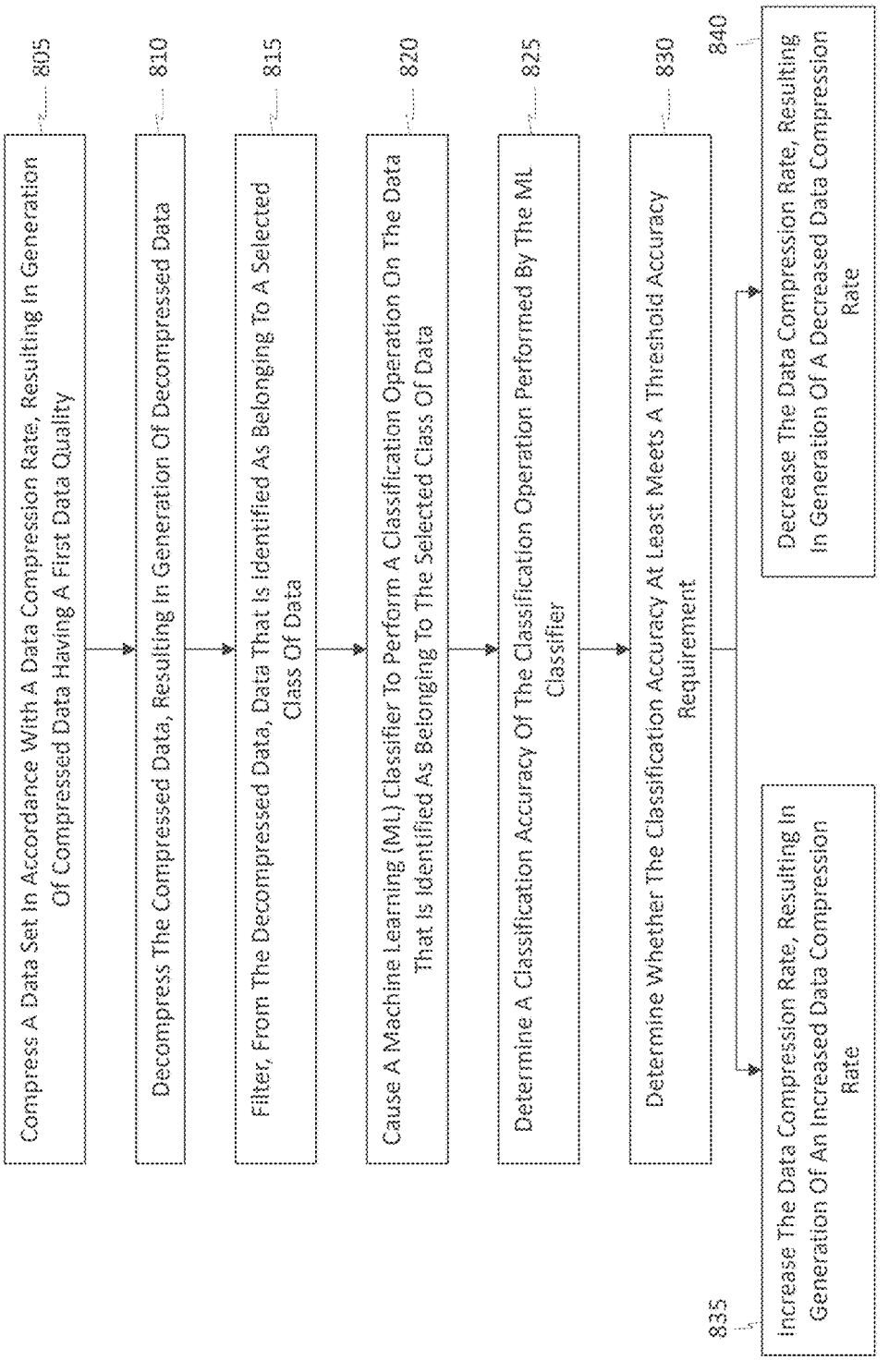

Compress A Data Set In Accordance With A Data Compression Rate, Resulting In Generation Of Compressed Data Having A First Data Quality — 805

Decompress The Compressed Data, Resulting In Generation Of Decompressed Data — 810

Filter, From The Decompressed Data, Data That Is Identified As Belonging To A Selected Class Of Data — 815

Cause A Machine Learning (ML) Classifier To Perform A Classification Operation On The Data That Is Identified As Belonging To The Selected Class Of Data — 820

Determine A Classification Accuracy Of The Classification Operation Performed By The ML Classifier — 825

Determine Whether The Classification Accuracy At Least Meets A Threshold Accuracy Requirement — 830

835 — Increase The Data Compression Rate, Resulting In Generation Of An Increased Data Compression Rate 840 — Decrease The Data Compression Rate, Resulting In Generation Of A Decreased Data Compression Rate

UI Device
925

Data Storage
930

Application(s)
935

Memory
905

NVRAM
910

Processor
915

Storage Media
920

OPTIMIZING LOSSY COMPRESSION FOR NONHOMOGENEOUS MULTIVARIATE BLACK-BOX CLASSIFICATION MODELS

COPYRIGHT AND MASK WORK NOTICE

TECHNOLOGICAL FIELD OF THE DISCLOSURE

Embodiments disclosed herein generally relate to improving the accuracy of a machine learning (ML) classifier. More particularly, at least some embodiments relate to systems, devices, hardware, software, computer-readable media, and methods for selecting an optimal data compression rate that achieves a threshold level of compression and that also enables an ML classifier to classify distorted data, which is distorted due to the compression, at a threshold level of classification accuracy.

BACKGROUND

Consider a scenario in which a machine learning (ML) classification model receives its input through a communication channel that is subject to one or more constraints (e.g., perhaps a bandwidth constraint). Such a scenario is increasingly more common as the application of ML models becomes more widespread.

As an example, classifier models deployed at the Cloud typically rely on different types of uploaded data, such as image data, time series data, video data, and so on. The classifier models then use the uploaded data to perform various inference operations. If the volume of the data is large, the inference time can become overly large as well, and the uploading process can also become quite costly, particularly in mobile networks with limited bandwidth.

To mitigate these costs and concerns, networks often apply compression to the data streams before communicating that data to the ML classifier. Lossy compression can cause distortions on the data, and those distortions can deteriorate the performance of the ML classifier.

BRIEF DESCRIPTION OF THE DRAWINGS

In order to describe the manner in which at least some of the advantages and features of one or more embodiments may be obtained, a more particular description of embodiments will be rendered by reference to specific embodiments thereof which are illustrated in the appended drawings. Understanding that these drawings depict only typical embodiments and are not therefore to be considered to be limiting of the scope of this disclosure, embodiments will be described and explained with additional specificity and detail through the use of the accompanying drawings.

FIG. 6 illustrates some example experimental data.

FIG. 7 illustrates some additional example experimental data.

FIG. 8 illustrates a flowchart of an example method for intelligently selecting a data compression rate.

DETAILED DESCRIPTION OF SOME EXAMPLE EMBODIMENTS

Figure 1:
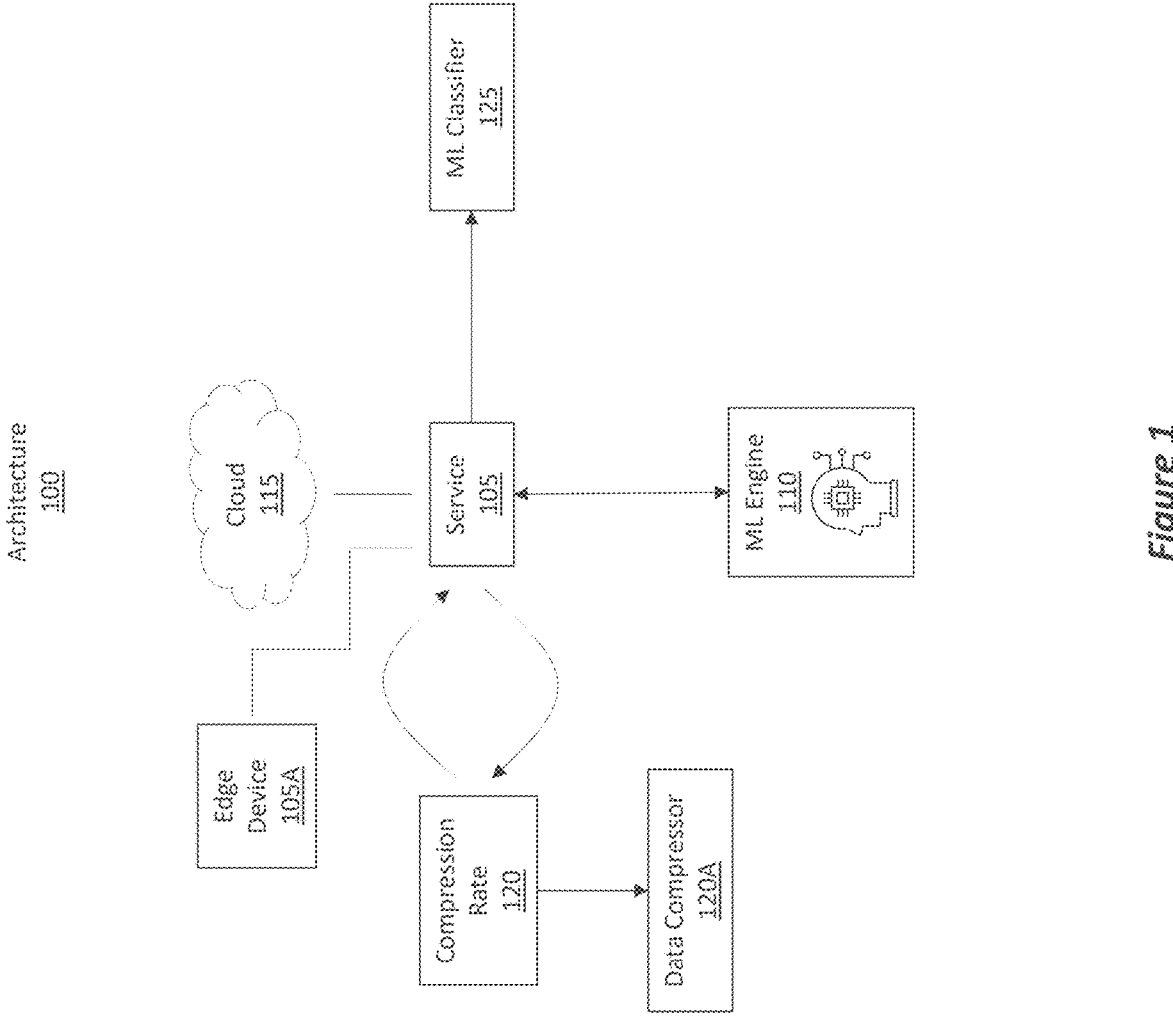
FIG. 1 illustrates an example computing architecture for iteratively selecting a compression rate that is designed to enable an ML classifier to have a threshold level of classification accuracy.

As mentioned earlier, edge devices often compress their data prior to transmission to a cloud-based ML classifier. This compression can deteriorate the quality of the data. If the ML classifier was trained to operate using high quality, non-deteriorated data, then the accuracy of the ML classifier may be reduced if it is required to operate using deteriorated data generated as a result of compression. Thus, it is desirable to choose an appropriate compression quality that maximizes compression (so as to minimize communication costs) while also ensuring a sufficiently high classification accuracy on the part of the ML classifier.

The above problem is quite complex. For instance, solutions to the above problem likely require consideration of how the compression impacts the ability of the ML classifier to effectively handle instances of each class of data. As one example, a first class of data may relate to sensor data describing the walking motion of a user holding a phone. A second class of data may relate to movement patterns of a person driving a vehicle. These are but some examples, and any class of data can be considered. Furthermore, different operational constraints and preferences are also likely to be considered depending on what application is involved.

The disclosed embodiments provide various solutions to the above problem. That is, the disclosed embodiments provide various benefits, advantages, solutions, and practical applications in how to deal with data that is to be transmitted from an edge node to a cloud node in a manner that achieves a threshold level of compression on the transmission side and that achieves a threshold level of accuracy on the ML classifier's side. With the assumption that a black-box ML classifier performs multi-class classification under various data communication constraints, the disclosed embodiments advantageously address a number of issues, some of which are recited below. By the phrase "black-box," it is generally meant that the disclosed embodiments can perform their operations without requiring knowledge or data as to the inner workings of the classifier. The embodiments exercise the classifier as a black-box by giving the classifier an input (e.g., a sample) and by operating on the output (i.e. classifier sample data).

For example, the embodiments are able to address an issue where different classes have different degrees of importance for the application, and the embodiments can determine how to select the optimal compression quality for a particular class. Given a set of compression algorithms, the embodiments can also beneficially determine which compression algorithm is best for the current application. The embodiments can also determine whether a particular compression algorithm is viable. By practicing the disclosed principles, the embodiments are able to not only improve the efficiency of the network (e.g., by using less bandwidth) but also improve the accuracy of the ML classifier when it is tasked with operating on lossy or distorted data.

Beneficially, the disclosed embodiments are directed to techniques that balance an objective to achieve an optimal classification accuracy on the part of the ML classifier and an objective to achieve a higher level of data compression so as to minimize costs. To that end, the embodiments advantageously determine an optimal compression quality for each class individually. This per-class analysis allows for greater gains in compression, while exploiting the different relations between attributes of the instances of each class. The embodiments can also facilitate a static analysis on the impact of different compression algorithms over each class for a black-box classifier model. This provides insights for fine-tuning compression algorithms and assessing a compression and classification pipeline. Accordingly, these and numerous other benefits will now be described in more detail throughout the remaining portions of this disclosure.

Having just described some of the various advantages provided by the disclosed embodiments, attention will now be directed to FIG. 1, which illustrates an example architecture 100 in which the disclosed principles may be employed. Architecture 100 shows a service 105.

As used herein, the term "service" refers to an automated program that is tasked with performing different actions based on input. In some cases, service 105 can be a deterministic service that operates fully given a set of inputs and without a randomization factor. In other cases, service 105 can be or can include a machine learning (ML) or artificial intelligence engine, such as ML engine 110. The ML engine 110 enables service 105 to operate even when faced with a randomization factor.

As used herein, reference to any type of machine learning or artificial intelligence (or LLM) may include any type of machine learning algorithm or device, convolutional neural network(s), multilayer neural network(s), recursive neural network(s), deep neural network(s), decision tree model(s) (e.g., decision trees, random forests, and gradient boosted trees) linear regression model(s), logistic regression model (s), support vector machine(s) ("SVM"), artificial intelligence device(s), or any other type of intelligent computing system. Any amount of training data may be used (and perhaps later refined) to train the machine learning algorithm to dynamically perform the disclosed operations.

In some implementations, service 105 is a local service operating on a local device, such as an edge device 105A. In some implementations, service 105 is a cloud service operating in a cloud 115 environment. In some implementations, service 105 is a hybrid service that includes a cloud component operating in the cloud 115 and a local component operating on a local device. These two components can communicate with one another. Thus, service 105 can operate in a cloud node or in an edge device. Often, service 105 is implemented in the cloud 115 and is used to determine a compression rate that the edge device 105A will subsequently use when transmitting data to the cloud 115. From the cloud 115, service 105 can instruct the edge device 105A to use the selected compression rate for future data transmissions with the cloud 115, and in particular with the ML classifier in the cloud 115.

It should be noted that the described "compression rate" has an inverse relationship to the "quality" of the data. A higher data compression rate means the data is subjected to more compression, resulting in more deterioration to the data and resulting in a lower quality of the data. On the other hand, a lower data compression rate means the data is subjected to less compression, resulting in less deterioration to the data and resulting in a higher quality of the data. Thus, "compression rate" refers to the level of compression that is applied to the data. A level of 100 means that maximum compression is achieved, resulting in poor quality data. A level of 0 means that no compression is performed, resulting in high quality data.

Multiclass classification problems can be applied to scenarios that involve different degrees of importance to the correct classification of individuals from each class. An ML classifier model can use unique sets of characteristics to discern individuals from each class. Usually, data compression algorithms distort each set of features differently, so that the input data compression process unevenly impacts the performance of an ML classifier on individuals from each class.

Thus, service 105 is generally configured to exploit the above pattern to determine an adequate compression quality for the application of a certain compression algorithm in the input data of a classification pipeline with a black-box ML classification model while also limiting the loss of accuracy in individuals of each class asymmetrically on the part of the ML classifier.

While meeting the application requirements, the embodiments can achieve a higher compression ratio when compared to the case in which all classes are considered homogeneously. The disclosed principles can also be employed in a scenario where there is a list of compression methods and it is desired to find the one that best suits the data-compressor-classifier group in hand. The disclosed principles are useful in various types of scenarios, such as applications whose models run in the cloud and such as where there is a bandwidth limitation to be circumvented.

To that end, service 105 is tasked with determining a compression rate 120 for a data compressor 120A residing in the edge device 105A. Using this compression rate 120, the data compressor 120A will compress data and transmit the data from the edge device 105A to a cloud-based (or at least a remotely located) ML classifier 125, which will then be tasked with classifying the data. Because of the compression, the transmitted data will be distorted in some manner. That distortion might adversely impact the accuracy performance of the ML classifier 125. To address such a scenario, service 105 is primarily tasked with determining the compression rate 120 that will achieve a threshold level of data compression on the side of the edge device 105A while simultaneously enabling the ML classifier 125 to classify data at a threshold level of accuracy.

By way of more detail, service 105 is tasked with determining a compression quality (i.e. the value "q") (which is inversely related to the compression rate 120) for a data compressor C (e.g., data compressor 120A) that is suitable for application to the input data X of a black box classifier f(X) (e.g., ML classifier 125), so that it is expected to maintain $T_j$% of the classification accuracy of j-th class individuals.

Figure 2:
FIG. 2 illustrates various different samples of compressed classification errors.

To demonstrate the above, first, an illustrative example of common characteristics of the relationship between classifiers and distortions generated by data compression will be presented in FIG. 2. Then, the operations that achieve these characteristics will be defined.

The relationship between the quality adopted when compressing the input data of a classifier with its performance is represented in the example graphs of FIG. 2, as shown by compressed samples classification errors 200. In this case, a multilayer perceptron classifier is being used to compress a basic motions dataset according to a discrete cosine transform (DCT) method. Each of the four subplots in FIG. 2 organizes (on the horizontal axis) the possible compression qualities (ranging from 1 to 100). A compression quality of 100 means that the data quality is very high (and thus little or no data compression occurred) while a compression quality of 1 means that the data quality is very poor (and thus maximum or a high level of data compression occurred).

On the vertical axis, each of the individuals in the database is organized. Each subplot is relative to a given class. The black region of each subplot relates to cases in which the ML classifier got the classification process wrong as a function of the compression quality, while the non-black region is relative to the cases in which the ML classifier carried out the process correctly.

Note that the impact of compressor distortions on the process of classifying individuals from different classes clearly has specificities. For example, as shown in FIG. 2, Class 2 individuals can be compressed with quality 28 without modifying the behavior of the classifier. However, the same cannot be said for Class 1 individuals.

In addition, in many cases, regions such as the one of Class 0 with compression quality between 14 and 28 were observed. This region presents a higher quantity of hits (i.e. non-black parts) than regions of higher compression quality (e.g., between 35 and 42). It was observed that it was not always possible to find this same pattern in new data and, therefore, the suggestion of compression qualities in regions such as this was avoided. Similarly, regions that meet the requirements of an application, but are very close to regions that do not, also have been observed to not be generalizable. In this sense, it is possible to observe these two types of regions as regions of instability. Service 105 of FIG. 1 is able to leverage these characteristics to determine a suitable compression quality level to be applied to the input data in a classification pipeline.

Figure 3:
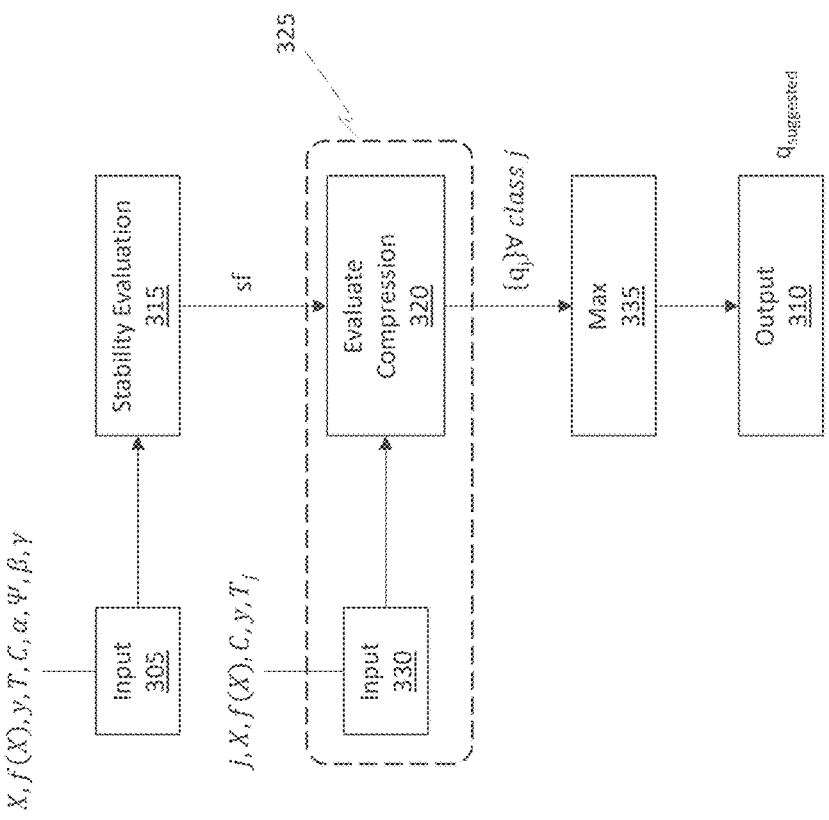
FIG. 3 illustrates a high level overview of how a data compression rate can be selected to achieve a threshold level of classification accuracy by an ML classifier.

Consider that a subset X of the input data of the black box classifier is available. FIG. 3 illustrates an example process flow 300 that is indicative of some of the steps of the disclosed operations.

The input 305 includes a subset of the input data X, the labels of X (i.e. "y"), a classifier model f(X), a vector of per-class maintained accuracy percentages T, the compression algorithm C, the parameters $\alpha$ and $\psi$ that regulate the stability evaluation, and the parameters $\beta$ and $\gamma$ that regulate the safety factor magnification. The output 310 include the suggested compression quality $q_{suggested}$.

The evaluate compression 320 is one of the primary aspects of the disclosed techniques and will be described in more detail below. The stability evaluation 315 step is an optional step where an instability pattern of the data-compressor-classifier group is learned and may be additionally magnified. It is done so that the suggested quality becomes more distant from regions of instability.

Regarding the evaluate compression 320 step, this step is performed for each class, as shown by iteration 325. Input 330 includes the following values: j, X, f(X), C, y, and $T_j$, as defined earlier. A max 335 operation is also performed to determine the output 310. Further details will be provided later.

Figure 4:
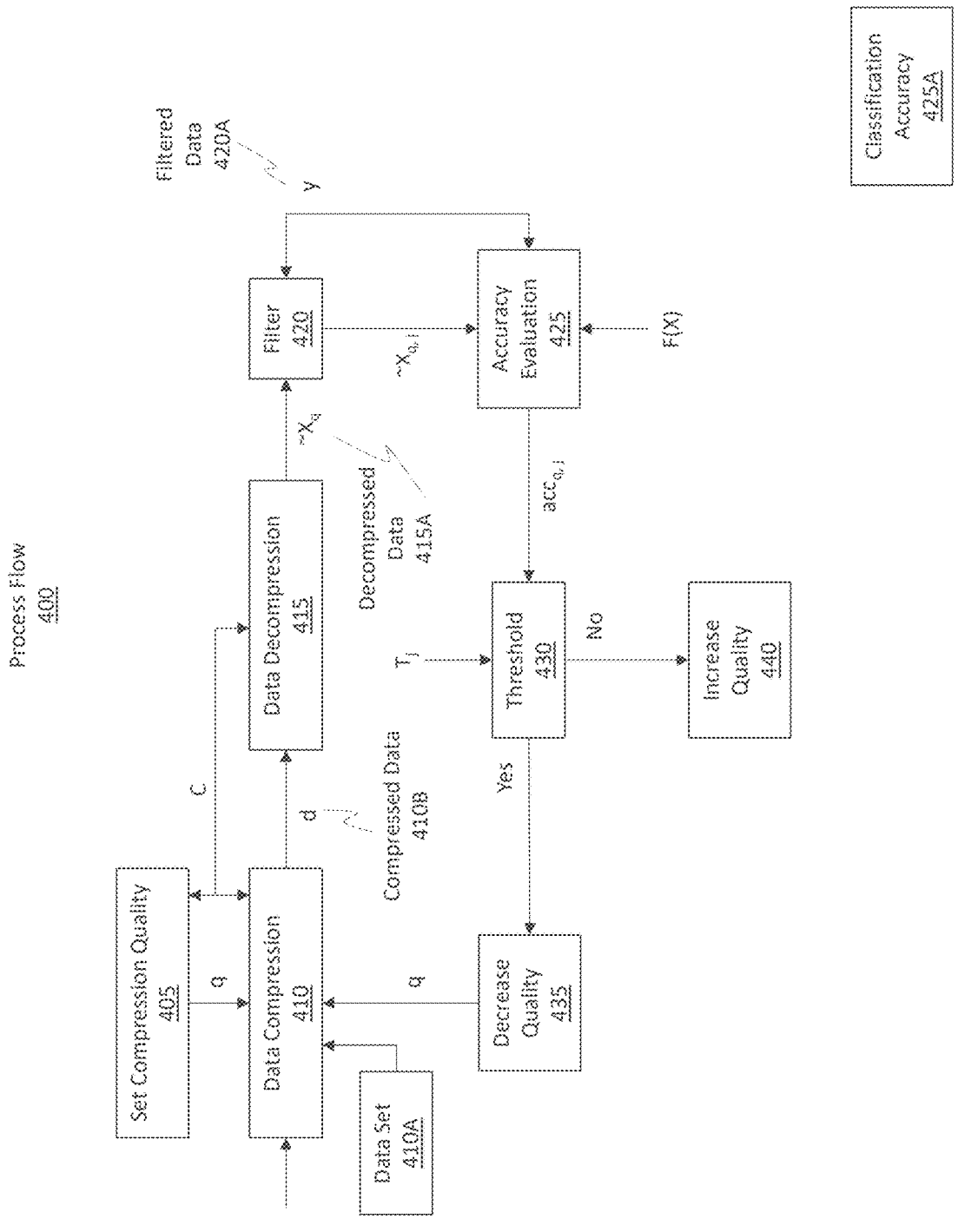
FIG. 4 illustrates a more detailed view of how the data compression rate is selected.

The iteration 325 process of evaluate compression 320 is further illustrated in FIG. 4 by the process flow 400. In FIG. 4, the steps also aim to determine the lowest quality value $q \in (0,100]$ whose compression of the data X by the compressor C produces distorted data of the j-th class $\tilde{X}_j$ that allow the classification $f(\tilde{X}_j)$ to preserve $T_j$ % of the classification accuracy obtained with data without distortions $f(X_j)$.

Process flow 400 starts the analysis considering the highest possible compression quality (e.g., the set compression quality 405 step) (perhaps the value 100, but also perhaps a lower value). The data (e.g., data set 410A) is then subjected to compression (e.g., in data compression 410) to produce compressed data 410B and decompression (e.g., data decompression 415) to produce decompressed data 415A to mimic how data is transmitted over a network and to introduce similar distortions as the ones that would occur during the data transmission from the edge device to the cloud.

Process flow 400 then calculates $\widetilde{X_q}$, which relates to how the compression method C with quality q distorts the input data X. In filter 420, the embodiments extract the class samples that are relevant for the current evaluation, as shown by filtered data 420A. Then, the performance of the ML classifier when fed with the distorted j-th class individuals $f(\tilde{X}_j)$ is evaluated. Subsequently, the obtained accuracy (e.g., as shown by classification accuracy 425A) is calculated to check (e.g., accuracy evaluation 425) whether the proposed accuracy level objective has been achieved.

The accuracy obtained in this way is called $acc_{q,j}$, while the accuracy obtained with the raw data of the j-th class individuals is called $acc_{\infty,j}$. In this way, the proposed objective can be checked based on the following inequality:

$$\frac{acc_{q,j}}{acc_{\infty,j}} < T_j$$

The threshold 430 step evaluates the above inequality. If the above inequality is true (i.e. "yes"), the quality (i.e. value "q") is decremented (e.g., as shown by decrease quality 435), and the process flow 400 is restarted using the new value for q by returning to the beginning of the distortion evaluation step (marked by the data compression 410 process). The quality of the data is decreased by using a higher level of compression, resulting in additional distortion to the data during the compression process.

Otherwise, process flow 400 returns q+1, as shown by increase quality 440. If the increase quality 440 step is performed, it means the level of accuracy has decreased too much, so the data compression rate should be decreased (i.e. less compression is performed), thereby increasing the resulting quality of the data by having less compression.

Process flow 400 is iteratively performed until a convergence value for q is identified. By convergence, it is meant that the embodiments progressively increase the data compression rate (q) to a level that resulted in the threshold accuracy requirement no longer being met, so the embodiments reversed one step and used the preceding (perhaps immediately preceding) data compression rate (q) that resulted in satisfaction of the threshold accuracy requirement.

After this process is carried out for all classes of individuals in X, the quality values obtained are conformed, since individuals of different classes will be compressed together. For this purpose, it is often beneficial to adopt the maximum quality value calculated for all classes, as illustrated in the max 335 step in FIG. 3 because it will help satisfy the requirements $T_j$ for all classes considered.

If the stability evaluation 315 step of FIG. 3 is incorporated (recall, it is an optional step), then the threshold 430 step in FIG. 4 can be somewhat modified, as further described below, and also uses the safety factor (sf) as input.

Regarding the stability evaluation 315 step of FIG. 3, it is common for different applications to have different risk tolerances. In this sense, the stability evaluation 315 step in FIG. 3 can be considered. One purpose of this additional step is to determine an adequate safety margin to promote greater certainty regarding adherence to the guarantee of accuracy reduction when submitted to new data that present statistical deviations from the original. Thus, this step increases the performance of the algorithm in cases where there is no availability of abundant data for the quality suggestion process defined earlier or where variations in the observed patterns are expected.

Figure 5:
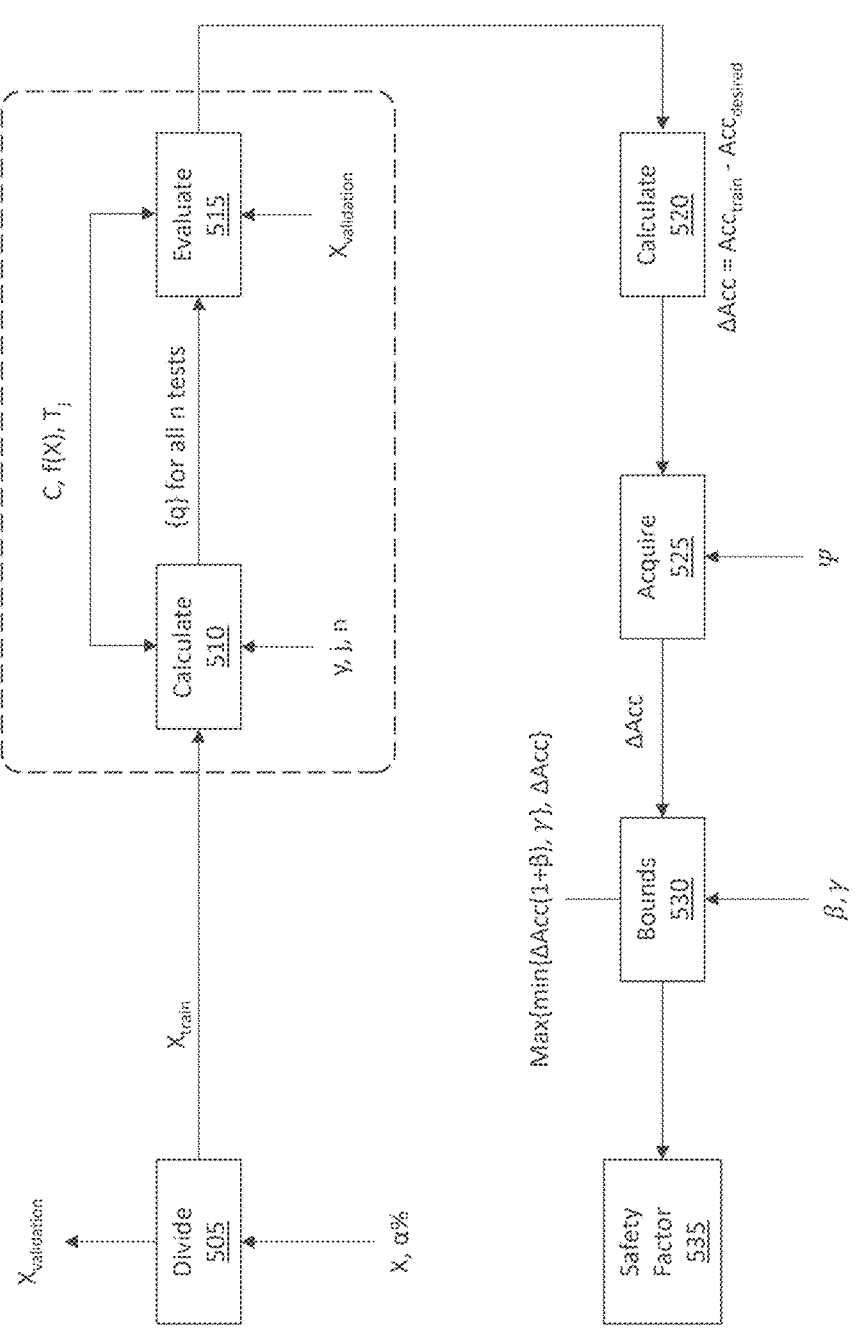
FIG. 5 illustrates an example stability evaluation.

The stability evaluation process is further detailed in FIG. 5, as shown by stability evaluation 500, which corresponds to the stability evaluation 315 step of FIG. 3. The stability evaluation 500 is focused on performing tests such as the one described in FIG. 4. The purpose of these tests is to examine aspects of the relationship between the distortion caused by the compressor and the attributes used in the classification process. The variations between each test define what is relevant to the case at hand. The embodiments consider at least two particular types of scenarios.

One scenario involves the goal of evaluating the relationship for different accuracy values for a given class. Another scenario involves the goal of evaluating the relationship for different orders of individuals in the data X.

A possible variation that allows the embodiments to analyze the first scenario is to assign a different vector of weights $T=\{T_j\}_{\forall\ class\ j}$ in each of the n tests, so that the values of interest are sufficiently explored. One way to probe the second scenario is by using a different shuffling of the individuals in each of the n tests. This allows the distortion effects caused by the data compressor to be exploited by varying the neighborhood relationship.

The input to the stability evaluation 500 (e.g., shown by input 305 in FIG. 3) is a subset of the input data X, the labels of X (i.e. "y"), a classifier model f(X), a vector of per class maintained accuracy percentages T, the compression algorithm C, the parameters $\alpha$ and $\psi$ that regulate the stability evaluation, and the parameters $\beta$ and $\gamma$ that regulate the safety factor magnification. The output is the safety factor (sf).

The stability evaluation 500 begins with the partitioning (e.g., see divide 505) of the dataset X into a training fraction $X_{train}$ with $(1-\alpha)$ % of the subjects and a validation fraction $X_{validation}$ with $\alpha$ %. Then, the n tests are performed with variations such as those described earlier. For instance, for each class, the calculate 510 step and the evaluate 515 step is performed. The calculate 510 step involves calculating the suggested compression quality with n random variations injected into the data X. The evaluate 515 step involves evaluating the validation performance.

After performing the above processes, one can identify cases in which the suggested quality meets the requirements for individuals in $X_{test}$, but does not meet it in $X_{validation}$. This relates to the presence of statistical variations between the test and validation partitions. It was observed that in most cases in which this occurs, the accuracy obtained by compressing the evaluated data (in this case $X_{train}$) with the quality q is very close to the requirement defined by T.

For this reason, the next steps include calculating (e.g., calculate 520) the difference between the training accuracy and the desired accuracy. In particular, the calculate 520 step includes calculating $\Delta$Acc by taking the difference between Acc and $Acc_{desired}$.

In the acquire 525 step, the embodiments define the value of the training accuracy difference $\Delta$acc such that $\Psi$ % of the n tests will be successful at the time of validation. At the bounds 530 step, $\Delta$acc is magnified $1+\beta$ times, while limiting by the threshold $\gamma$ to compose the safety factor sf 535.

After the above process is complete, the process of achieving the suggested compression quality q defined earlier is modified to take into account the calculated safety factor sf. This can be done with a small change in the conditional expression of the threshold 430 step in FIG. 4. In addition to evaluating the veracity of the condition, it is also worthwhile to evaluate whether the difference between the desired accuracy and the one obtained with distorted data with compression quality q is greater than the limit adopted, according to the condition listed below.

$$T_j \cdot acc_{\infty,j} - acc_{q,j} \geq sf$$

Next, some experiments will be presented in order to attest to the methodology's capability to answer the proposed questions. To this end, the MNIST, Basic Motions, and Italy Demand datasets were used in the tests together with classifiers that solve pertinent problems and are based on three different models: Multilayer Perceptron (MLP), Support Vector Machine (SVM) and Logistic Regression (LOG). In addition, the application of three types of compression algorithms is analyzed: the compression by means of the Discrete Cosine Transform (DCT), according to the JPEG format, and according to the Refined Lightweight Temporal Compression (RLTC).

The evaluation metric of the compression algorithms is based on the following compression ratio:

$$Cr = \frac{compressed\ size}{raw\ size}$$

First, illustrative tests of the application of the proposed method with specific cases will be presented. Then, more extensive tests will be presented. In all cases, the datasets were divided into training sets with 75% of the individuals, and test sets with a proportion of 25%.

Initially, the tests involve consideration of non-uniform requirements for different classes. A common scenario is one in which a problem has a set of critical classes, whose correct classification is more relevant than that of the others, according to the service-level agreement (SLA) for the application. It is desirable to show that the analysis of the relationship of the effects of data compression on individuals of each class in a discriminated way makes it possible to obtain a higher compression ratio, while ensuring that the application requirements are maintained.

Suppose a problem in which one wants to identify the class of individuals in the MNIST dataset, where the classes 1 and 7 are critical, and for this one desires to use an MLP classifier. Consider that it is enough for individuals of classes 1 and 7 to maintain $T_{1,7}=95\%$ of the accuracy obtained with the classifier with raw data and that it is necessary to maintain $T_{0,2,3,4,5,6,8,9}=75\%$ of the original accuracy for individuals of the other classes. In order to better evaluate performance, the individuals of this dataset were separated into training and test sets.

While the overall suggested quality in the first case was set to be 76, in the second it was set to be 56. This generated a compression ratio of 77% in the first case and 56% in the second. In all cases, the variation between training and test accuracy was less than 8% of the original per class while the requisites T were satisfied. By using the disclosed techniques to suggest an appropriate quality value for the compression of the data that feeds a given model according to certain accuracy requirements, it is possible to compare the affinity between different compression methods and a given classification pipeline.

To illustrate this application, the Basic Motions dataset and the vector T=[0.75, 0.95, 0.65, 0.75] was chosen for a test run. By applying the methodology described herein, beneficial results were obtained. The compression and preserved accuracy rates are shown in table 600 of FIG. 6. Note, that once the requirements have been met in all cases, it is possible to compare the compression methods' performances and suggest the most suitable method. In this case, when observing the compression ratio, the RLTC can be suggested as the most appropriate. This result is justified by the interaction between the classifier and the distortions caused by the compression methods.

In order to better validate the generalization of the disclosed method, it was envisaged to carry out tests that encompassed different types of scenarios. In this sense, in addition to using datasets with different types of application domains, with different data organization schemes, and classifiers based on different models, it was desirable to also represent application scenarios with different SLA requirements, where different quality levels will be required for individuals of different classes. In order to explore the latter objective, a test was carried out with 200 random vectors T, whose inputs are sampled from a uniform distribution. The results of the test performed according to the methodology described herein are organized in Table 700 of FIG. 7.

Each column of table 700 refers to the result obtained by analyzing the training or test partition of a dataset according to a compression method. The rows refer to the type of model used in the classification pipeline. Finally, each cell presents the result of the 200 random tests.

The mean compression ratios are the average values of all tests, calculated in each case according to the Cr expression described earlier. Success rates, on the other hand, indicate the percentage of tests that meet the requirements. They are not always the same as the unit in the test suite. It was observed that it is common for some drift to occur in the characteristics relevant to the distortions caused by the compression process between training and test sets. In this sense, the methodology described herein can be used to better explore this aspect, detecting regions of instability so that they can be avoided.

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Attention will now be directed to FIG. 8, which illustrates a flowchart of an example method 800 for determining (perhaps in an iterative manner) a compression data rate that achieves a threshold level of compression (perhaps a maximum level of compression) while at the same time achieving a threshold level of classification accuracy on the part of an ML classifier (perhaps a maximum level of accuracy). Method 800 can be implemented within the architecture 100 of FIG. 1, and can be performed by the service 105. Method 800 primarily relates to the operations illustrated in FIG. 4.

Method 800 includes an act (act 805) of compressing a data set (e.g., data set 410A of FIG. 4) in accordance with a data compression rate (e.g., compression rate 120 of FIG. 1). This compression results in the generation of compressed data (e.g., compressed data 410B) having a first data quality.

Act 810 includes decompressing the compressed data. This decompression results in the generation of decompressed data (e.g., decompressed data 415A). The process of compressing the data set and subsequently decompressing the compressed data is performed to mimic a data transmission between an edge device and a cloud node.

Act 815 includes filtering, from the decompressed data, certain data. This filtered data (e.g., filtered data 420A) is data that is identified as belonging to a selected class of data.

Act 820 includes causing a machine learning (ML) classifier (e.g., ML classifier 125) to perform a classification operation on the data that is identified as belonging to the selected class of data.

Act 825 includes determining a classification accuracy (e.g., classification accuracy 425A) of the classification operation performed by the ML classifier. The process of determining the classification accuracy can be performed via a number of operations. One operation involves accessing a first result of the ML classifier, where the first result is generated in response to the ML classifier performing the classification operation on the data that is identified as belonging to the selected class of data. Another operation involves filtering, from the data set, second data that is identified as belonging to the selected class of data. Another operation includes causing the ML classifier to perform the classification operation on the second data, which has not been subjected to compression or decompression. Notably, the ML classifier generates a second result in response to performing the classification operation on the second data. Another operation includes comparing the first result with the second result to identify a difference. Another operation includes determining the classification accuracy based on the difference.

In some implementations, the process of determining the classification accuracy of the classification operation is based on a relation between (i) a first accuracy obtained when the ML classifier operates on the data that is identified as belonging to the selected class of data and (ii) a second accuracy obtained when the ML classifier operates on uncompressed data obtained from the data set. Here, the uncompressed data is also data that is identified as belonging to the selected class of data.

Act 830 includes determining whether the classification accuracy at least meets a threshold (e.g., threshold 430) accuracy requirement. As indicated above, the classification accuracy can be dependent on a relationship or ratio between different accuracies that have been determined, such as an accuracy based on the raw data and an accuracy based on the compressed (and hence distorted) data.

In response to determining that the classification accuracy at least meets the threshold accuracy requirement, act 835 includes increasing the data compression rate, resulting in generation of an increased data compression rate. Notably, use of the increased data compression rate causes a subsequent reduction (e.g., decrease quality 435) in data quality for data that is compressed at the increased data compression rate as compared to the first data quality.

On the other hand, in response to determining that the classification accuracy does not at least meet the threshold accuracy requirement, act 840 includes decreasing the data compression rate, resulting in generation of a decreased data compression rate. Here, use of the decreased data compression rate causes a subsequent increase (e.g., increase quality 440) in data quality for data that is compressed at the decreased data compression rate as compared to the first data quality.

In some scenarios, method 800 is iteratively performed until a convergence data compression rate is identified. By convergence, it is meant that the embodiments progressively increased the data compression rate (resulting in decreased data quality) to a level that resulted in the threshold accuracy requirement no longer being met, so the embodiments reversed one or more steps and used the preceding (perhaps immediately preceding) data compression rate that resulted in satisfaction of the threshold accuracy requirement.

In some scenarios, random variations are injected into the data set as was described relative to the calculate 510 step of FIG. 5. Also, in some scenarios, the data set is included in a larger data set that has been divided to produce a validation data set and a training data set, where the data set is the training data set, as shown in the divide 505 step of FIG. 5.

A stability evaluation (e.g., stability evaluation 315 of FIG. 3) can also be performed. This evaluation can be performed prior to compressing the data set. Optionally, the stability evaluation involves identification of an instability pattern of a data compressor, which performs said compressing, and the ML classifier.

It should be recognized how any of the disclosed features can be recited in combination with any of the other combined features. Thus, unless explicitly recited otherwise, features recited herein are combinable with other features, regardless of whether those features are illustrated in different figures or different portions of this disclosure.

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which, when executed, cause a general-purpose computer, special purpose computer, or special purpose processing device to perform a certain function or group of functions. As such, some embodiments of the invention may be downloadable to one or more systems or devices, for example, from a website, mesh topology, or other source. Also, the scope of the invention embraces any hardware system or device that comprises an instance of an application that comprises the disclosed executable instructions.

Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term module, client, engine, agent, services, and component are examples of terms that may refer to software objects or routines that execute on the computing system. The different components, modules, engines, and services described herein may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments where one or more of a client, server, or other machine may reside and operate in a cloud environment.

Figure 9:
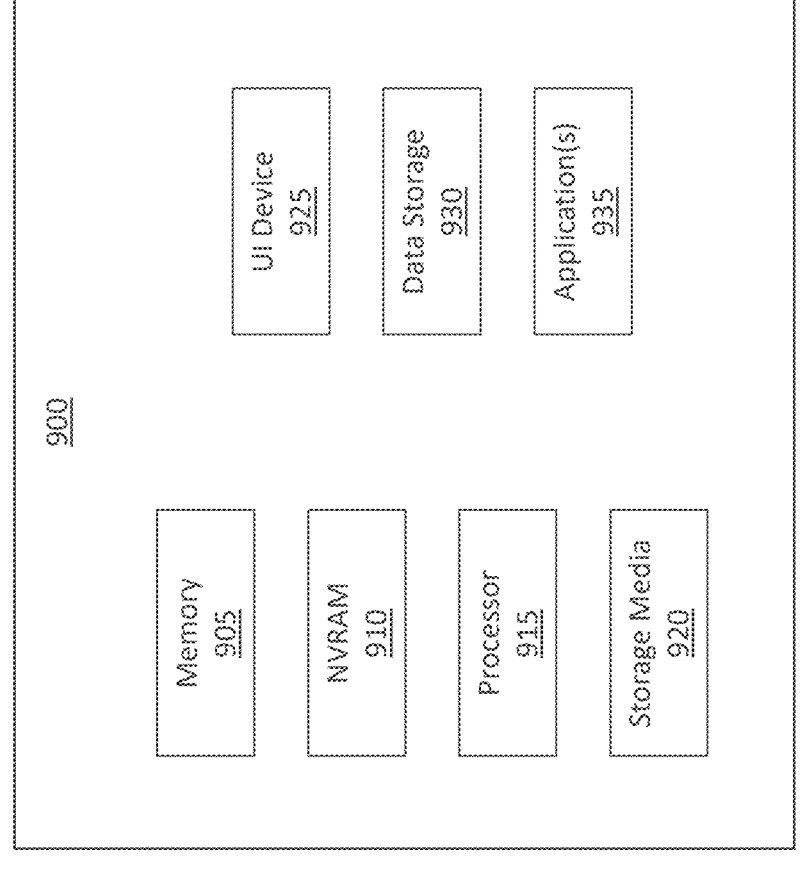
FIG. 9 illustrates an example computer system that can be configured to perform any of the disclosed operations.

With reference briefly now to FIG. 9, any one or more of the entities disclosed, or implied, by the Figures and/or elsewhere herein, may take the form of, or include, or be implemented on, or hosted by, a physical computing device, one example of which is denoted at 900. This example device can be in the form of the edge device 105A of FIG. 1. Also, where any of the aforementioned elements comprise or consist of a virtual machine (VM), that VM may constitute a virtualization of any combination of the physical components disclosed in FIG. 9.

In the example of FIG. 9, the physical computing device 900 includes a memory 905 which may include one, some, or all, of random access memory (RAM), non-volatile memory (NVM) 910 such as NVRAM for example, read-only memory (ROM), and persistent memory, one or more hardware processors 915, non-transitory storage media 920, UI device 925, and data storage 930. One or more of the memory 905 of the physical computing device 900 may take the form of solid-state device (SSD) storage. Also, one or more applications 935 may be provided that comprise instructions executable by one or more hardware processors to perform any of the operations, or portions thereof, disclosed herein.

Such executable instructions may take various forms including, for example, instructions executable to perform any method or portion thereof disclosed herein, and/or executable by/at any of a storage site, whether on-premises at an enterprise, or a cloud computing site, client, datacenter, data protection site including a cloud storage site, or backup server, to perform any of the functions disclosed herein. As well, such instructions may be executable to perform any of the other operations and methods, and any portions thereof, disclosed herein. The physical device 900 may also be representative of an edge system, a cloud-based system, a datacenter or portion thereof, or other system or entity.

The disclosed embodiments can be implemented in numerous different ways, as described in the various different clauses recited below.

Clause 1. A method comprising: compressing a data set in accordance with a data compression rate, resulting in generation of compressed data having a first data quality; decompressing the compressed data, resulting in generation of decompressed data; filtering, from the decompressed data, data that is identified as belonging to a selected class of data; causing a machine learning (ML) classifier to perform a classification operation on the data that is identified as belonging to the selected class of data; determining a classification accuracy of the classification operation performed by the ML classifier; determining whether the classification accuracy at least meets a threshold accuracy requirement; in response to determining that the classification accuracy at least meets the threshold accuracy requirement, increasing the data compression rate, resulting in generation of an increased data compression rate, wherein use of the increased data compression rate causes a subsequent reduction in data quality for data that is compressed at the increased data compression rate as compared to the first data quality; and in response to determining that the classification accuracy does not at least meet the threshold accuracy requirement, decreasing the data compression rate, resulting in generation of a decreased data compression rate, wherein use of the decreased data compression rate causes a subsequent increase in data quality for data that is compressed at the decreased data compression rate as compared to the first data quality.

Clause 2. The method of clause 1, wherein compressing the data set and subsequently decompressing the compressed data is performed to mimic a data transmission between an edge device and a cloud node.

Clause 3. The method of clause 1, wherein determining the classification accuracy is performed by: accessing a first result of the ML classifier, the first result being generated in response to the ML classifier performing the classification operation on the data that is identified as belonging to the selected class of data; filtering, from the data set, second data that is identified as belonging to the selected class of data; causing the ML classifier to perform the classification operation on the second data, which has not been subjected to compression or decompression, wherein the ML classifier generates a second result in response to performing the classification operation on the second data; and comparing the first result with the second result to identify a difference; and determining the classification accuracy based on the difference.

Clause 4. The method of clause 1, wherein said method is iteratively performed until a convergence data compression rate is identified.

Clause 5. The method of clause 1, wherein random variations are injected into the data set.

Clause 6. The method of clause 1, wherein the data set is included in a larger data set that has been divided to produce a validation data set and a training data set, and wherein said data set is the training data set.

Clause 7. The method of clause 1, wherein a stability evaluation is performed prior to compressing the data set, and wherein the stability evaluation involves identification of an instability pattern of a data compressor, which performs said compressing, and the ML classifier.

Clause 8. The method of clause 1, wherein determining the classification accuracy of the classification operation is based on a relation between (i) a first accuracy obtained when the ML classifier operates on the data that is identified as belonging to the selected class of data and (ii) a second accuracy obtained when the ML classifier operates on uncompressed data obtained from the data set, where the uncompressed data is also data that is identified as belonging to the selected class of data.

Clause 9. A computer system comprising: one or more processors; and one or more hardware storage devices that store instructions that are executable by the one or more processors to cause the computer system to: compress a data set in accordance with a data compression rate, resulting in generation of compressed data having a first data quality; decompress the compressed data, resulting in generation of decompressed data; filter, from the decompressed data, data that is identified as belonging to a selected class of data; cause a machine learning (ML) classifier to perform a classification operation on the data that is identified as belonging to the selected class of data; determine a classification accuracy of the classification operation performed by the ML classifier; determine whether the classification accuracy at least meets a threshold accuracy requirement; in response to determining that the classification accuracy at least meets the threshold accuracy requirement, increase the data compression rate, resulting in generation of an increased data compression rate, wherein use of the increased data compression rate causes a subsequent reduction in data quality for data that is compressed at the increased data compression rate as compared to the first data quality; and in response to determining that the classification accuracy does not at least meet the threshold accuracy requirement, decrease the data compression rate, resulting in generation of a decreased data compression rate, wherein use of the decreased data compression rate causes a subsequent increase in data quality for data that is compressed at the decreased data compression rate as compared to the first data quality.

Clause 10. The computer system of clause 9, wherein compressing the data set and subsequently decompressing the compressed data is performed to mimic a data transmission between an edge device and a cloud node.

Clause 11. The computer system of clause 9, wherein determining the classification accuracy is performed by: accessing a first result of the ML classifier, the first result being generated in response to the ML classifier performing the classification operation on the data that is identified as belonging to the selected class of data; filtering, from the data set, second data that is identified as belonging to the selected class of data; causing the ML classifier to perform the classification operation on the second data, which has not been subjected to compression or decompression, wherein the ML classifier generates a second result in response to performing the classification operation on the second data; and comparing the first result with the second result to identify a difference; and determining the classification accuracy based on the difference.

Clause 12. The computer system of clause 9, wherein random variations are injected into the data set.

Clause 13. The computer system of clause 9, wherein determining the classification accuracy of the classification operation is based on a relation between (i) a first accuracy obtained when the ML classifier operates on the data that is identified as belonging to the selected class of data and (ii) a second accuracy obtained when the ML classifier operates on uncompressed data obtained from the data set, where the uncompressed data is also data that is identified as belonging to the selected class of data.

Clause 14. One or more hardware storage devices that store instructions that are executable by one or more processors to cause the one or more processors to perform operations comprising: compressing a data set in accordance with a data compression rate, resulting in generation of compressed data having a first data quality; decompressing the compressed data, resulting in generation of decompressed data; filtering, from the decompressed data, data that is identified as belonging to a selected class of data; causing a machine learning (ML) classifier to perform a classification operation on the data that is identified as belonging to the selected class of data; determining a classification accuracy of the classification operation performed by the ML classifier; determining whether the classification accuracy at least meets a threshold accuracy requirement; in response to determining that the classification accuracy at least meets the threshold accuracy requirement, increasing the data compression rate, resulting in generation of an increased data compression rate, wherein use of the increased data compression rate causes a subsequent reduction in data quality for data that is compressed at the increased data compression rate as compared to the first data quality; and in response to determining that the classification accuracy does not at least meet the threshold accuracy requirement, decreasing the data compression rate, resulting in generation of a decreased data compression rate, wherein use of the decreased data compression rate causes a subsequent increase in data quality for data that is compressed at the decreased data compression rate as compared to the first data quality.

Clause 15. The one or more hardware storage devices of clause 14, wherein determining the classification accuracy is performed by: accessing a first result of the ML classifier, the first result being generated in response to the ML classifier performing the classification operation on the data that is identified as belonging to the selected class of data; filtering, from the data set, second data that is identified as belonging to the selected class of data; causing the ML classifier to perform the classification operation on the second data, which has not been subjected to compression or decompression, wherein the ML classifier generates a second result in response to performing the classification operation on the second data; and comparing the first result with the second result to identify a difference; and determining the classification accuracy based on the difference.

Clause 16. The one or more hardware storage devices of clause 14, wherein random variations are injected into the data set.

Clause 17. The one or more hardware storage devices of clause 14, wherein the data set is included in a larger data set that has been divided to produce a validation data set and a training data set, and wherein said data set is the training data set.

Clause 18. The one or more hardware storage devices of clause 14, wherein a stability evaluation is performed prior to compressing the data set, and wherein the stability evaluation involves identification of an instability pattern of a data compressor, which performs said compressing, and the ML classifier.

Clause 19. The one or more hardware storage devices of clause 14, wherein determining the classification accuracy of the classification operation is based on a relation between (i) a first accuracy obtained when the ML classifier operates on the data that is identified as belonging to the selected class of data and (ii) a second accuracy obtained when the ML classifier operates on uncompressed data obtained from the data set, where the uncompressed data is also data that is identified as belonging to the selected class of data.

Clause 20. The one or more hardware storage devices of clause 14, wherein compressing the data set and subsequently decompressing the compressed data is performed to mimic a data transmission between an edge device and a cloud node.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope. It should also be noted how any feature recited herein can be combined with any other feature recited herein.

What is claimed is:

1. A method comprising:
compressing a data set in accordance with a data compression rate, resulting in generation of compressed data having a first data quality;
decompressing the compressed data, resulting in generation of decompressed data;
filtering, from the decompressed data, data that is identified as belonging to a selected class of data;
causing a machine learning (ML) classifier to perform a classification operation on the data that is identified as belonging to the selected class of data;
determining a classification accuracy of the classification operation performed by the ML classifier;
determining whether the classification accuracy at least meets a threshold accuracy requirement;
in response to determining that the classification accuracy at least meets the threshold accuracy requirement, increasing the data compression rate, resulting in generation of an increased data compression rate, wherein use of the increased data compression rate causes a subsequent reduction in data quality for data that is compressed at the increased data compression rate as compared to the first data quality; and
in response to determining that the classification accuracy does not at least meet the threshold accuracy requirement, decreasing the data compression rate, resulting in generation of a decreased data compression rate, wherein use of the decreased data compression rate causes a subsequent increase in data quality for data that is compressed at the decreased data compression rate as compared to the first data quality.

2. The method of claim 1, wherein compressing the data set and subsequently decompressing the compressed data is performed to mimic a data transmission between an edge device and a cloud node.

3. The method of claim 1, wherein determining the classification accuracy is performed by:
accessing a first result of the ML classifier, the first result being generated in response to the ML classifier performing the classification operation on the data that is identified as belonging to the selected class of data;

filtering, from the data set, second data that is identified as belonging to the selected class of data;

causing the ML classifier to perform the classification operation on the second data, which has not been subjected to compression or decompression, wherein the ML classifier generates a second result in response to performing the classification operation on the second data; and comparing the first result with the second result to identify a difference; and determining the classification accuracy based on the difference.

4. The method of claim 1, wherein said method is iteratively performed until a convergence data compression rate is identified.

5. The method of claim 1, wherein random variations are injected into the data set.

6. The method of claim 1, wherein the data set is included in a larger data set that has been divided to produce a validation data set and a training data set, and wherein said data set is the training data set.

7. The method of claim 1, wherein a stability evaluation is performed prior to compressing the data set, and wherein the stability evaluation involves identification of an instability pattern of a data compressor, which performs said compressing, and the ML classifier.

8. The method of claim 1, wherein determining the classification accuracy of the classification operation is based on a relation between (i) a first accuracy obtained when the ML classifier operates on the data that is identified as belonging to the selected class of data and (ii) a second accuracy obtained when the ML classifier operates on uncompressed data obtained from the data set, where the uncompressed data is also data that is identified as belonging to the selected class of data.

9. A computer system comprising:

one or more processors; and one or more hardware storage devices that store instructions that are executable by the one or more processors to cause the computer system to:

compress a data set in accordance with a data compression rate, resulting in generation of compressed data having a first data quality;

decompress the compressed data, resulting in generation of decompressed data;

filter, from the decompressed data, data that is identified as belonging to a selected class of data;

cause a machine learning (ML) classifier to perform a classification operation on the data that is identified as belonging to the selected class of data;

determine a classification accuracy of the classification operation performed by the ML classifier;

determine whether the classification accuracy at least meets a threshold accuracy requirement;

in response to determining that the classification accuracy at least meets the threshold accuracy requirement, increase the data compression rate, resulting in generation of an increased data compression rate, wherein use of the increased data compression rate causes a subsequent reduction in data quality for data that is compressed at the increased data compression rate as compared to the first data quality; and in response to determining that the classification accuracy does not at least meet the threshold accuracy requirement, decrease the data compression rate, resulting in generation of a decreased data compression rate, wherein use of the decreased data compression rate causes a subsequent increase in data quality for data that is compressed at the decreased data compression rate as compared to the first data quality.

10. The computer system of claim 9, wherein compressing the data set and subsequently decompressing the compressed data is performed to mimic a data transmission between an edge device and a cloud node.

11. The computer system of claim 9, wherein determining the classification accuracy is performed by:

accessing a first result of the ML classifier, the first result being generated in response to the ML classifier performing the classification operation on the data that is identified as belonging to the selected class of data;

filtering, from the data set, second data that is identified as belonging to the selected class of data;

causing the ML classifier to perform the classification operation on the second data, which has not been subjected to compression or decompression, wherein the ML classifier generates a second result in response to performing the classification operation on the second data; and comparing the first result with the second result to identify a difference; and determining the classification accuracy based on the difference.

12. The computer system of claim 9, wherein random variations are injected into the data set.

13. The computer system of claim 9, wherein determining the classification accuracy of the classification operation is based on a relation between (i) a first accuracy obtained when the ML classifier operates on the data that is identified as belonging to the selected class of data and (ii) a second accuracy obtained when the ML classifier operates on uncompressed data obtained from the data set, where the uncompressed data is also data that is identified as belonging to the selected class of data.

14. One or more hardware storage devices that store instructions that are executable by one or more processors to cause the one or more processors to perform operations comprising:

compressing a data set in accordance with a data compression rate, resulting in generation of compressed data having a first data quality;

decompressing the compressed data, resulting in generation of decompressed data;

filtering, from the decompressed data, data that is identified as belonging to a selected class of data;

causing a machine learning (ML) classifier to perform a classification operation on the data that is identified as belonging to the selected class of data;

determining a classification accuracy of the classification operation performed by the ML classifier;

determining whether the classification accuracy at least meets a threshold accuracy requirement;

in response to determining that the classification accuracy at least meets the threshold accuracy requirement, increasing the data compression rate, resulting in generation of an increased data compression rate, wherein use of the increased data compression rate causes a subsequent reduction in data quality for data that is compressed at the increased data compression rate as compared to the first data quality; and in response to determining that the classification accuracy does not at least meet the threshold accuracy requirement, decreasing the data compression rate, resulting in generation of a decreased data compression rate, wherein use of the decreased data compression rate causes a subsequent increase in data quality for data that is compressed at the decreased data compression rate as compared to the first data quality.

15. The one or more hardware storage devices of claim 14, wherein determining the classification accuracy is performed by:

accessing a first result of the ML classifier, the first result being generated in response to the ML classifier performing the classification operation on the data that is identified as belonging to the selected class of data;

filtering, from the data set, second data that is identified as belonging to the selected class of data;

causing the ML classifier to perform the classification operation on the second data, which has not been subjected to compression or decompression, wherein the ML classifier generates a second result in response to performing the classification operation on the second data; and comparing the first result with the second result to identify a difference; and determining the classification accuracy based on the difference.

16. The one or more hardware storage devices of claim 14, wherein random variations are injected into the data set.

17. The one or more hardware storage devices of claim 14, wherein the data set is included in a larger data set that has been divided to produce a validation data set and a training data set, and wherein said data set is the training data set.

18. The one or more hardware storage devices of claim 14, wherein a stability evaluation is performed prior to compressing the data set, and wherein the stability evaluation involves identification of an instability pattern of a data compressor, which performs said compressing, and the ML classifier.

19. The one or more hardware storage devices of claim 14, wherein determining the classification accuracy of the classification operation is based on a relation between (i) a first accuracy obtained when the ML classifier operates on the data that is identified as belonging to the selected class of data and (ii) a second accuracy obtained when the ML classifier operates on uncompressed data obtained from the data set, where the uncompressed data is also data that is identified as belonging to the selected class of data.

20. The one or more hardware storage devices of claim 14, wherein compressing the data set and subsequently decompressing the compressed data is performed to mimic a data transmission between an edge device and a cloud node.

* * * * *